(12) United States Patent
Kitatani et al.

(10) Patent No.: US 9,780,529 B2
(45) Date of Patent: Oct. 3, 2017

(54) SEMICONDUCTOR OPTICAL DEVICE AND MANUFACTURING METHOD THEREOF

(71) Applicant: Oclaro Japan, Inc., Kanagawa (JP)

(72) Inventors: Takeshi Kitatani, Tokyo (JP); Shinji Sasaki, Nagano (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 14/623,696

(22) Filed: Feb. 17, 2015

(65) Prior Publication Data

US 2015/0236477 A1    Aug. 20, 2015

(30) Foreign Application Priority Data

Feb. 18, 2014  (JP) .................. 2014-028194

(51) Int. Cl.
*H01S 5/12* (2006.01)
*H01S 5/026* (2006.01)
(Continued)

(52) U.S. Cl.
CPC .......... *H01S 5/1231* (2013.01); *H01S 5/0265* (2013.01); *H01S 5/2275* (2013.01); *H01S 5/3063* (2013.01); *H01S 5/0267* (2013.01); *H01S 5/06226* (2013.01); *H01S 5/18* (2013.01); *H01S 5/2224* (2013.01); *H01S 5/32325* (2013.01); *H01S 5/34306* (2013.01); *H01S 5/34326* (2013.01)

(58) Field of Classification Search
CPC . H01S 5/34326; H01S 5/32325; H01S 5/1231
See application file for complete search history.

(56) References Cited

U.S. PATENT DOCUMENTS

| 5,079,184 A | 1/1992 | Hatano et al. |
| 5,381,756 A | 1/1995 | Kondo et al. |

(Continued)

FOREIGN PATENT DOCUMENTS

| JP | 3-87019 A | 4/1991 |
| JP | 0613334 | 1/1994 |

(Continued)

OTHER PUBLICATIONS

Toshikazu Onishi, High-Power and High-Temperature Operation of Mg-Doped AlgalnP-Based Red Laser Diodes, IEEE Journal of Quantum Electronics, vol. 40, No. 12, Dec. 2004.
(Continued)

*Primary Examiner* — Tod T Van Roy
(74) *Attorney, Agent, or Firm* — Mattingly & Malur, PC (57) ABSTRACT

To provide a semiconductor optical device with device resistance reduced for optical communication. The semiconductor optical device includes an active layer (306) for emitting light through recombination of an electron and a hole; a diffraction grating (309) having a pitch defined in accordance with an output wavelength of the light emitted; a first semiconductor layer (311) including at least Al, made of In and group-V compound, and formed on the diffraction grating; and a second semiconductor layer (307) including Mg, made of In and group-V compound, and formed on the first semiconductor layer (311).

4 Claims, 10 Drawing Sheets

(51) Int. Cl.
H01S 5/227 (2006.01)
H01S 5/30 (2006.01)
*H01S 5/343* (2006.01)
*H01S 5/323* (2006.01)
*H01S 5/062* (2006.01)
*H01S 5/18* (2006.01)
*H01S 5/22* (2006.01)

(56) References Cited

U.S. PATENT DOCUMENTS

| | | | |
|---|---|---|---|
| 6,574,256 B1* | 6/2003 | Hofstetter et al. | 372/45.01 |
| 2005/0135453 A1* | 6/2005 | Kneissl | B82Y 20/00 |
| | | | 372/94 |
| 2009/0116527 A1* | 5/2009 | Arimura | H01S 5/187 |
| | | | 372/46.01 |
| 2009/0257462 A1* | 10/2009 | Furukawa | H01S 5/4062 |
| | | | 372/22 |
| 2010/0008391 A1 | 1/2010 | Nakagawa et al. | |
| 2011/0272670 A1* | 11/2011 | Kawaguchi et al. | 257/13 |
| 2012/0140785 A1 | 6/2012 | Nakagawa et al. | |
| 2014/0183446 A1* | 7/2014 | Nago | H01L 33/007 |
| | | | 257/13 |

FOREIGN PATENT DOCUMENTS

| | | |
|---|---|---|
| JP | 9-116233 A | 5/1997 |
| JP | 10-22579 A | 1/1998 |
| JP | 2005-136162 A | 5/2005 |
| JP | 2008-198942 A | 8/2008 |
| JP | 2009-267231 A | 11/2009 |
| JP | 2010-98201 A | 4/2010 |

OTHER PUBLICATIONS

Japanese Office Action received in corresponding Japanese Application No. 2014-028194 dated Jun. 27, 2017.

* cited by examiner

SEMICONDUCTOR OPTICAL DEVICE AND MANUFACTURING METHOD THEREOF

CROSS-REFERENCE TO RELATED APPLICATION

The present application claims priority from Japanese application JP 2014-028194, filed on Feb. 18, 2014, the content of which is hereby incorporated by reference into this application.

BACKGROUND OF THE INVENTION

1. Field of the Invention

The present invention relates to a semiconductor optical device, such as a semiconductor laser device or the like, and a manufacturing method of the semiconductor optical device.

2. Description of the Related Art

With a recent explosive increase of individuals using the Internet, rapid increase of an information transmission speed and enlargement of transmission capacity are required, and optical communication is expected to remain bearing an important role. As a light source for use in optical communication, a semiconductor laser device is mainly used. For transmission in a short distance of about 10 km, a direct modulation system is used to directly drive a semiconductor laser, using an electric signal. According to this system, a module can be implemented in a simple structure and thus requires smaller power consumption as well as a fewer number of components, which can reduce costs. Meanwhile, for optical transmission in a long distance in excess of 10 km, as direct modulation of a semiconductor laser alone cannot achieve such transmission, an electro-absorption modulator integrated semiconductor laser device having an optical modulator unit integrated is used.

To enlarge transmission capacity of optical communication, it is necessary to achieve a higher modulation speed of a semiconductor laser than the current one. However, as the modulation speed of a semiconductor laser is subjected to restriction due to a product of a device capacitance and a device resistance (a CR time constant), further increase of the modulation speed requires reduction of device resistance or device capacitance.

There are roughly two types available for a basic structure of a semiconductor optical device, namely, a buried-hetero (BH) structure and a ridge wave-guide (RWG) structure. Generally, a semiconductor optical device has an active layer, such as a multiple-quantum-well (MQW) layer or the like, for emitting light through recombination of an electron and a hole, deposited between a p-type cladding layer and an n-type cladding layer. Further, in order to achieve a lasing spectrum in a single mode, a diffraction grating layer is formed within a cladding layer.

To reduce device resistance, it is effective to reduce resistance of a p-type cladding layer having a hole, which has lower mobility compared to an electron, as a carrier. In the above, conventionally, zinc (Zn) is used as a dopant for a p-type cladding layer. However, as Zn has readily diffusible nature, as known, excessive increase of the doping concentration of a p-InP cladding layer in order to reduce device resistance results in remarkable increase of the amount of Zn diffusion in an adjacent MQW layer. This increases optical loss, and thus deteriorates the characteristic of a semiconductor laser.

In a BH structure device, in particular, as Zn is excessively diffused in an insulating portion around the MQW layer and insulation is thereby deteriorated. As a result, a leak path of current is formed, which increases current components not being introduced into the MQW layer but flowing avoiding the MQW layer. Therefore, considering Zn diffusion, there is a limit to the amount of Zn doping concentration that can be increased, and thus to the amount of device resistance that can be reduced by increasing the Zn doping concentration.

IEEE Journal of Quantum Electronics, Vol. 40, No. 12, December 2004 reports Mg as a new dopant that is substituted for Zn. That is, it is reported that use of Mg for a p-type cladding layer made of AlGaInP enables doping with lower diffusion at higher concentration than that when Zn is used.

In connection with a problem of doping delay caused when Mg is used as a p-type dopant for AlGaInP material, JP H06-13334 A discloses use of mixed gas of Mg organic metal compound and Al organic metal compound as p-type impurity in MOVPE crystal growth.

SUMMARY OF THE INVENTION

Generally, a wavelength region between 1300 to 1550 nm is used for a semiconductor optical device for optical communication. In order to use this wavelength region, a semiconductor material made of In and group-V compound, for example, an InP is used instead of an AlGaInP, which is described in the above mentioned JP H06-13334 A and IEEE Journal of Quantum Electronics, Vol. 40, No. 12, December 2004. In this case, in formation of a layer doped with Mg, instead of Zn, a semiconductor film including Al is formed prior to the InP semiconductor films, as proposed in the above mentioned JP H06-13334 A. Inclusion of Al decreases the lattice constant of the semiconductor film. This increases the difference in lattice constant between the semiconductor film including Al and the InP semiconductor film, as a result of which lattice misfit dislocation is more likely caused. In a semiconductor device for optical communication, in particular, diffraction grating is often formed. When a semiconductor film including Al atoms therein, having a higher melting point and smaller atomic migration brought about smoothening unevenness, is formed on the diffraction grating, dislocation and crystal defect due to lattice misfit is likely caused due to the unevenness of the diffraction grating. Further, the Al dope causes a larger band gap than InP, which hinders the current flowing into the MQW layer. This may possibly cause increase of resistance or the like.

The present invention have been conceived in view of the above, and aims to provide a semiconductor optical device having device resistance reduced for optical communication.

Our study in order to attain the above described object proves that insertion of a layer including Al prior to formation of a Mg doped layer can prevent doping delay of the Mg doped layer to be thereafter grown. Al organic metal is not simultaneously supplied when the Mg doped layer is being formed. That is, this is a different mechanism from that described in JP H06-13334 A, in which "Mg organic metal compound is mixed with Al organic metal compound to make mixed gas and the property of the Mg organic metal compound is thereby changed, as a result of which the adhering rate of Mg organic metal to the pipe and the reaction tube in use is reduced". Although the mechanism in which formation of a layer including Al in advance prevents doping delay is not fully explained, it is assumed that this is because a factor (impurity or the like) that makes Mg organic metal compound more likely adhered to a pipe and a reaction tube in use, which causes doping delay, is reduced in the process of supplying Al organic metal. Based on the above described knowledge, the present invention has been conceived as described below.

A semiconductor optical device according to the present invention may include an active layer for emitting light through recombination of an electron and a hole; a diffraction grating having a pitch defined in accordance with an output wavelength of the light emitted; a first semiconductor layer including at least Al, made of In and group-V compound, and formed on the diffraction grating; and a second semiconductor layer including Mg, made of In and group-V compound, and formed on the first semiconductor layer.

In the semiconductor optical device according to the present invention, the first semiconductor may be formed so as to have a thickness between 0.3 nm and 5 nm inclusive. Further, an Al concentration of the first semiconductor layer may be between $1\times10^{16}$ and $1\times10^{20}$ cm$^{-3}$ inclusive.

A semiconductor optical device according to the present invention may include an active layer for emitting light through recombination of an electron and a hole; a first semiconductor layer including Al at a concentration between $1\times10^{16}$ and $1\times10^{20}$ cm$^{-3}$ inclusive and made of In and group-V compound; and a second semiconductor layer including Mg, made of In and group-V compound, and formed on the first semiconductor layer.

The semiconductor optical device according to the present invention may further include a diffraction grating having a pitch defined in accordance with an output wavelength of the light emitted. Further, the first semiconductor may be formed so as to have a thickness between 0.3 nm and 5 nm inclusive.

A manufacturing method of a semiconductor optical device according to the present invention may include an active layer forming step of forming an active layer for emitting light through recombination of an electron and a hole; a diffraction grating forming step of forming a diffraction grating having a pitch defined in accordance with an output wavelength of the light emitted; a first semiconductor layer forming step of forming a first semiconductor layer including at least Al, made of In and group-V compound, and formed on the diffraction grating; and a second semiconductor layer forming step of forming a second semiconductor layer including Mg, made of In and group-V compound, and formed on the first semiconductor layer.

In the manufacturing method of the semiconductor optical device according to the present invention, the first semiconductor layer may be formed so as to have a thickness between 0.3 nm and 5 nm inclusive, and also a concentration of Al in the first semiconductor layer may be between $1\times10^{16}$ and $1\times10^{20}$ cm$^{-3}$ inclusive.

For example, an AlInP layer at an Al concentration at a doping level is formed so as to be very thin on the uppermost surface of a base substrate having a diffraction grating layer, and an InP layer with Mg doped therein is thereafter formed. This makes it possible to dope Mg without delay. Moreover, as the concentration of the Al doped is very low and the AlInP layer is very thin, there is no influence in lattice misfit and the band structure.

Mg organic metal is not supplied simultaneously while a semiconductor layer including Al is being formed according to the present invention. However, there is a case in which after a Mg doped layer is formed through crystal growth, the doped Mg is diffused into the semiconductor layer including Al, so that Mg seems doped in the semiconductor layer including Al. This case as well is included in the present invention, and the effect of the present invention can be achieved in this case as well.

Further, the first semiconductor forming step may be a part of a series of process with the second semiconductor layer forming step. For example, in formation of a second semiconductor layer including Mg and made of In and group-V compound, organic metal including Al may be supplied to the reaction tube before the temperature reaches the growth temperature of the second semiconductor layer. In this case, if a layer including Al is formed so as to have a desired Al concentration and film thickness due to Al atoms remaining in the reaction tube before the second semiconductor layer is formed, the effect of the present invention can be obtained. Also even in the case where Mg organic metal is supplied simultaneously when supplying organic metal including Al, Mg is substantially not introduced into the layer including Al as the temperature is below the growing temperature of the second semiconductor layer, and a second semiconductor layer including Mg is formed after the temperature reaches the growing temperature. However, Mg may be diffused into the semiconductor layer including Al after the growth, as described above.

According to the semiconductor optical device and a manufacturing method of the semiconductor optical device of the present invention, it is possible to reduce device resistance.

DETAILED DESCRIPTION OF THE INVENTION

In the following, embodiments of the present invention will be described referring to FIGS. 1 to 10. In the embodiments below, although only a semiconductor optical device formed on an InP substrate is described, the present invention is applicable to other III-V compound semiconductor devices having the same structure.

First Embodiment

Figure 1:
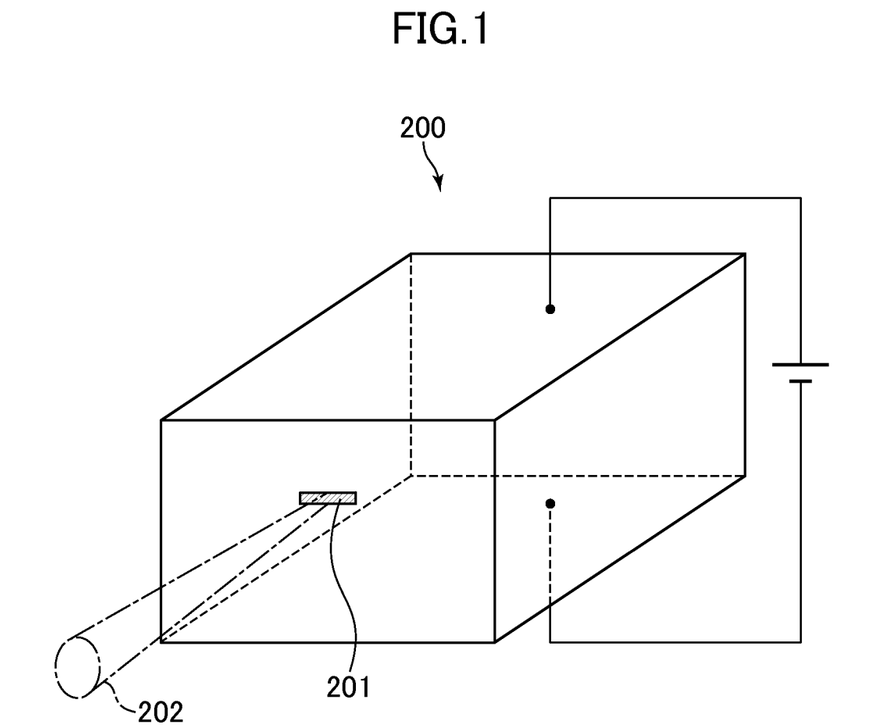
FIG. 1 schematically shows an edge emitting semiconductor laser device, which is a semiconductor optical device according to a first embodiment of the present invention.

FIG. 1 schematically shows an edge emitting semiconductor laser device 200 that is a semiconductor optical device according to a first embodiment of the present invention. As shown in the diagram, the semiconductor laser device 200 causes a difference in potential between two electrodes formed on the respective opposed surfaces of a substantially rectangular parallelepiped body, to thereby output a laser beam 202 from an active area 201.

Figure 2:
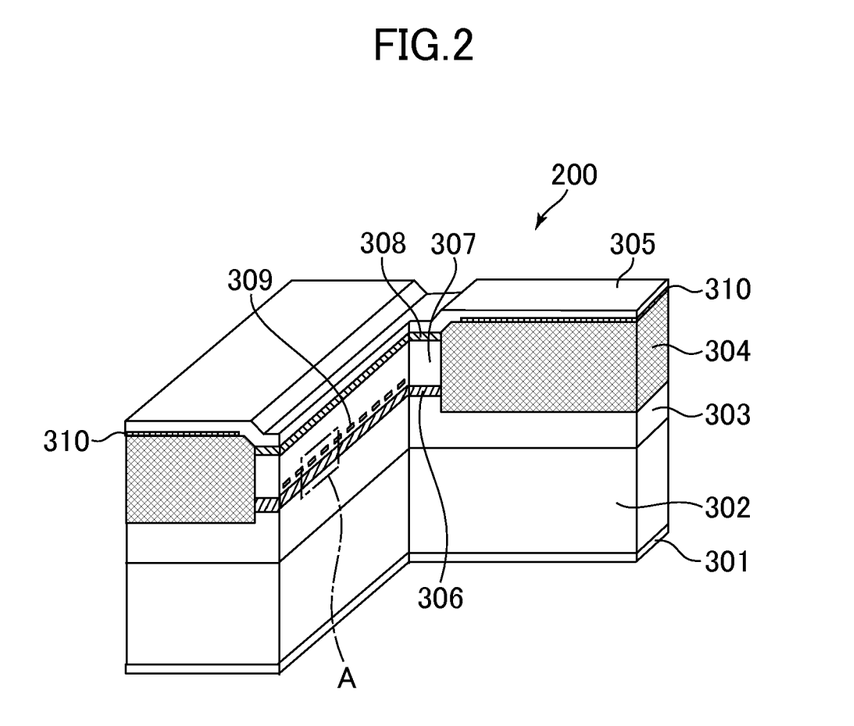
FIG. 2 is a partially sectional perspective view explaining a structure of the semiconductor laser device shown in FIG. 1.
Figure 3:
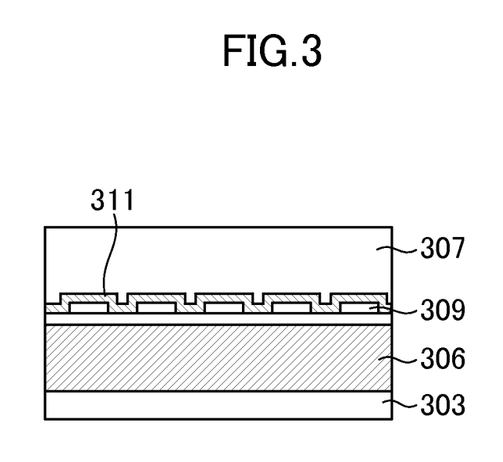
FIG. 3 schematically shows enlarged the part indicated by A in FIG. 2.
Figure 4:
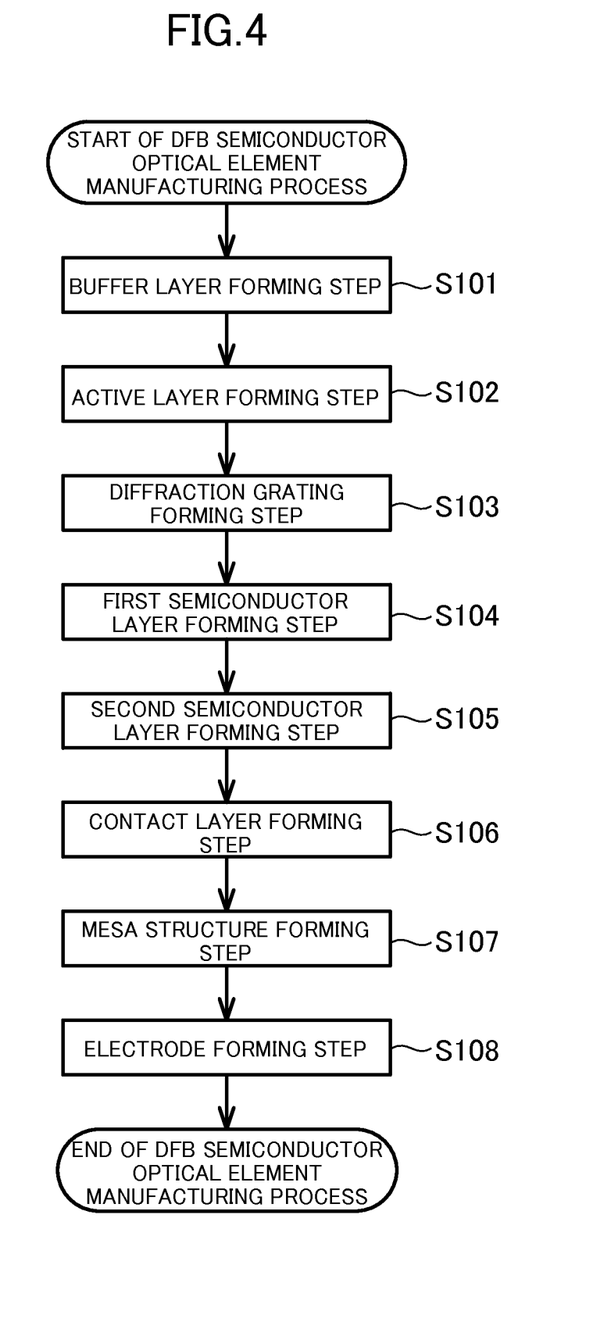
FIG. 4 schematically shows a manufacturing process of the semiconductor laser device shown in FIG. 2

FIG. 2 is a partially sectional perspective view explaining a structure of the semiconductor laser device 200 shown in FIG. 1. The semiconductor laser device 200 shown is a DFB (Distributed Feedback) semiconductor laser device. FIG. 3 schematically shows enlarged the part indicated by A in FIG. 2. FIG. 4 schematically shows a manufacturing process of the semiconductor laser device 200.

In the following, a manufacturing process of the semiconductor laser device 200 will be described while referring to a structure thereof. Initially, at a buffer layer forming step S101, an n-InP buffer layer 303 is formed on an n-InP substrate 302. Thereafter, at an active layer forming step S102, an MQW layer 306 that is an active layer made of InGaAsP for emitting light through recombination of an electron and a hole is formed. Then, at a diffraction grating forming step S103, a diffraction grating 309 having a pitch defined in accordance with a wavelength of a light outputted is formed. In general, a p-InP cap layer is formed on the upper part for protection. At a first semiconductor layer forming step S104 after the diffraction grating forming step S103, an undoped AlInP layer 311 of 1 nm thick that is a first semiconductor layer including Al and made of In and group-V compound is formed, in which the thickness may be desirably defined between 0.3 nm and 5 nm inclusive. This is a film thickness at an atomic layer level. That is, the film thickness is set so thin that substantially does not hinder a carrier transport. As the above described structure prevents doping delay, and the inserted layer including Al has no influence in an Mg doped layer formed thereafter and a subsequent crystal structure, it is possible to form a device structure as substantially designed. In the above, although the Al concentration is set to $1 \times 10^{17}$ cm$^{-3}$, the Al concentration may be defined between $1 \times 10^{16}$ and $1 \times 10^{20}$ cm$^{-3}$ inclusive. Note that the lower limit of concentration is determined based on a fact that an effect of the present invention can be obtained at a value close to the current measurement limit of atomic percentage detection analysis (for example, secondary ion mass spectrometry). Further, the upper limit of concentration is defined, based on a critical value in generation of lattice misfit dislocation on the base substrate with diffraction grating.

Further, an upper p-InP cladding layer 307 that is a second semiconductor layer doped with Mg and made of In and group-V compound is formed such that the diffraction grating 309 is buried therein (a second semiconductor layer forming step S105), and a p$^+$-InGaAs contact layer 308 is then successively formed (a contact layer forming step S106). In the above, as the AlInP layer 311 is inserted, no doping delay is caused with the upper p-InP cladding layer 307. Further, at a mesa structure forming step S107, after a mesa stripe mask is formed on the multi-layer structure and a part other than the mesa structure is removed by etching, appropriate pretreatment is executed, and an Ru doped InP layer 304 is formed through buried-Hetero growing. In the above, CH$_3$Cl is simultaneously added. Thereafter, at an electrode forming step S108, a passivation film 310, an upper electrode 305, a lower electrode 301 are formed, using a normal device manufacturing method, whereby the semiconductor laser device 200 is completed.

Note here that at the first semiconductor layer forming step S104, the second semiconductor layer forming step S105, and the forming step of the Ru doped InP layer 304 (S107), the MOVPE (Metal-Organic Vapor Phase Epitaxy) method is used. Hydrogen is used as carrier gas. Trimethylaluminium (TMA), triethylgallium (TEG), and trimethylindium (TMI) are used as material of group-III element. Arsine (AsH3) and phosphine (PH3) are used as material of group-V element. Disilane (Si2H6) is used as n-type dopant. Cyclopentadienyl magnesium (Cp2Mg) is used as p-type dopant. Methyl chloride (CH3Cl) is used as halogen atom-containing gas to be doped. Bis-(ethylcyclopentadienyl) ruthenium is used as organic metal material of Ru. Note that a crystal growing method is not limited to the MOVPE, and methods, including MBE (Molecular Beam Epitaxy) method, a CBE (Chemical Beam Epitaxy) method, MOMBE (Metal-organic Molecular Beam Epitaxy) method, may produce the same effect as that of the present invention.

A threshold current of the semiconductor laser device 200 manufactured as described above is 15 mA at 85° C., exhibiting high optical output characteristic in excess of 20 mW. Further, the device resistance is low and modulation characteristic is preferable. Still further, the device characteristic is not deteriorated even in a long time operation, which proves high device reliability. Yet further, a high yield rate in generation of the semiconductor laser device 200 is resulted.

Second Embodiment

Figure 5:
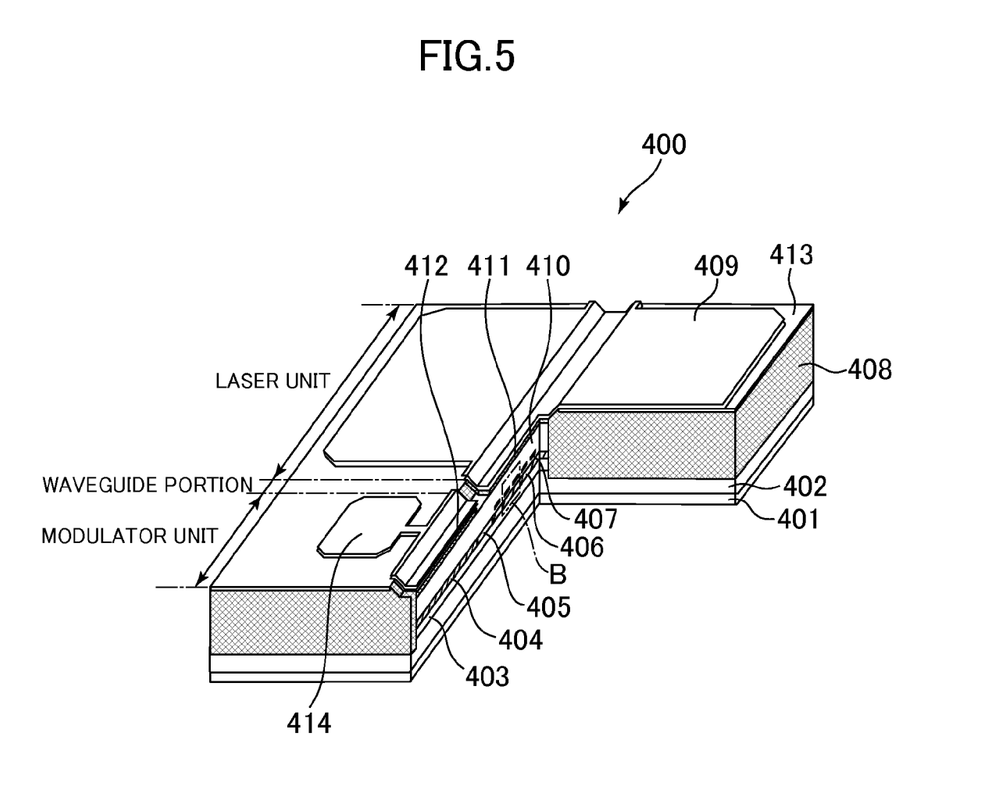
FIG. 5 is a partially sectional perspective view explaining a structure of a semiconductor laser device according to a second embodiment.
Figure 6:
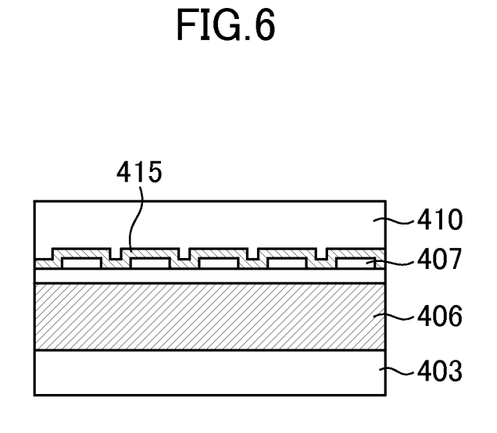
FIG. 6 schematically shows enlarged the part indicated by B in FIG. 5.
Figure 7:
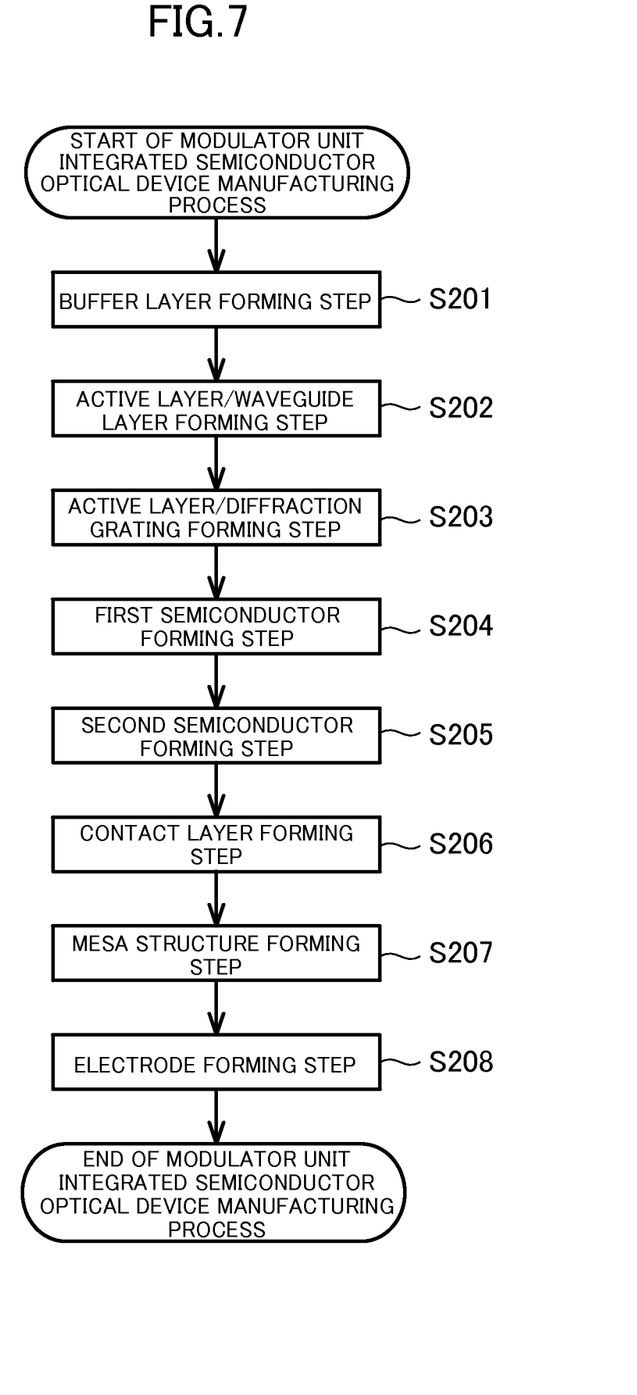
FIG. 7 schematically shows a manufacturing process of the semiconductor laser device shown in FIG. 5.

FIG. 5 is a partially sectional perspective view, similar to FIG. 2, explaining a structure of a semiconductor laser device 400 according to a second embodiment. The semiconductor laser device 400 shown is a modulator integrated semiconductor optical device, in which a modulator unit, a waveguide portion, and a laser unit are formed inside the semiconductor laser device 400. FIG. 6 schematically shows enlarged the part indicated by B in FIG. 5. FIG. 7 schematically shows a manufacturing process of the semiconductor laser device 400. Similar to the first embodiment, the MOVPE method is used as a growing method. Material of group-III element is the same as that in the first embodiment. Hydrogen chloride (HCl) is used as halogen atom-containing gas to be doped.

In the following, a manufacturing process of the semiconductor laser device 400 will be described, while referring to a structure thereof. Initially, at a buffer layer forming step S201, an n-InP buffer layer 403 is formed on the n-InP substrate 402. Thereafter, at an active layer/waveguide layer forming step S202, an InGaAlAs made MQW layer 404 in the modulator unit is grown. Generally, a p-InP cap layer is formed on the upper part for protection in most of the cases. Thereafter, a mask pattern is formed in a desired position on the wafer, and the p-InP cap layer and the MQW layer 404 are removed using the mask pattern as an etching mask. Thereafter, at an active layer/diffraction grating forming step S203, the wafer is placed in the reaction tube to grow an InGaAlAs made MQW layer 406 in the laser unit, a diffraction grating 407, and a p-InP cap layer through butt-joint regrowth. Thereafter, after the above mentioned mask is removed, a BJ mask is formed again in desired positions on the MQW layer 404 in the modulator unit and the MQW layer 406 in the laser unit, respectively, and the MQW and the p-InP cap layer are removed by etching. Further, a waveguide layer 405 made of InGaAsP and a p-InP cap layer are formed through BJ regrowth. In the above, BJ connection is simultaneously formed with two points of the modulator unit and the laser unit. Then, the wafer is taken out from the reaction tube, and the mask is then removed. Further, a diffraction grating 407 is formed on the MQW layer 406 in the laser unit.

Thereafter, a p-InP cladding layer 410 that is a second semiconductor layer with Mg doped therein is grown. This step is executed in the procedure below. That is, initially, the wafer is placed in the reaction tube, and the temperature of the wafer is increased to where the p-InP cladding layer 410, or the second semiconductor layer with Mg doped therein, can grow. In increasing the temperature, Al and Mg organic metal is supplied into the reaction tube (a first semiconductor forming step S204). As a result, an undoped AlInP layer 415 of 0.5 nm thick that is a first semiconductor layer is formed. In the above, Mg organic metal is supplied to the reaction tube but not introduced into the AlInP layer as the wafer temperature is low, so that undoped AlInP layer 415 is resulted. In the above, although the Al concentration is set to $1 \times 10^{19}$ cm$^{-3}$, the Al concentration may be desirably defined in the range between $1 \times 10^{16}$ and $1 \times 10^{20}$ cm$^{-3}$ inclusive. Then, before or when the wafer temperature becomes one where the p-InP cladding layer 410, or the second semiconductor layer, can grow, supply of Al organic metal is stopped to grow the p-InP cladding layer 410, or the second semiconductor layer with Mg doped therein, on the entire surface of the wafer (a second semiconductor forming step S205). Then, at a contact layer forming step S206, a p$^+$-InGaAs contact layer is grown before ending the crystal growing process.

As the AlInP layer 415 is inserted, no doping delay is caused in the p-InP cladding layer 410. Further, at a mesa structure forming step S207, after a mesa stripe mask is formed on the multi-layer structure and a part other than the mesa structure is removed by etching, appropriate preprocessing is executed, and an Ru doped InP layer 408 is formed through buried-Hetero growing. In the above, HCl gas is simultaneously added. In order to prevent return light due to reflection of emitting light at an exit end, the exit end on the modulator unit side is buried in the Ru doped InP layer 408, which is a so-called window structure. Thereafter, at an electrode forming step S208, after a p$^+$-InGaAs contact layer of the upper part of the waveguide portion is removed and a p$^+$-InGaAs contact layer 412 in the modulator unit and a p-InGaAs contact layer 411 in the laser unit are isolated from each other, a passivation film 413 is formed, using a normal device manufacturing method, and an upper electrode 414 in the modulator unit and an upper electrode 409 and a lower electrode 401 in the laser unit are formed. With the above, the semiconductor laser device 400 is completed.

A threshold current of the semiconductor laser device 400 manufactured as described above is 15 mA at 85° C., exhibiting preferable modulation characteristic of 10 GHz in the range between −5° C. and 85° C. inclusive without a cooling device. Further, the device characteristic is not deteriorated even in a long time operation, which proves high device reliability. Still further, a high yield rate in generation of the semiconductor laser device 400 is resulted. Note that not only InGaAlAs material but also InGaAsP material or InGaAsP material doped with Sb or N therein can be used for MQW in the laser unit or the modulator unit.

Third Embodiment

Figure 8:
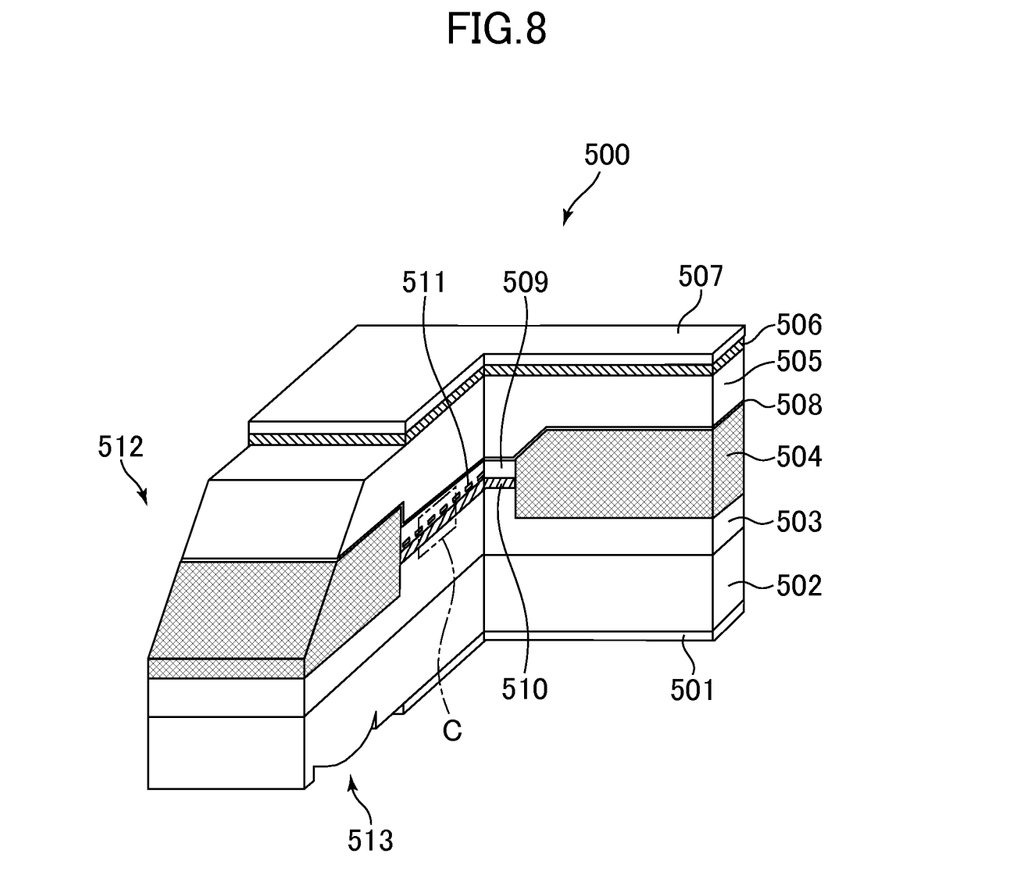
FIG. 8 is a partially sectional perspective view explaining a structure of a semiconductor laser device according to the second embodiment.
Figure 9:
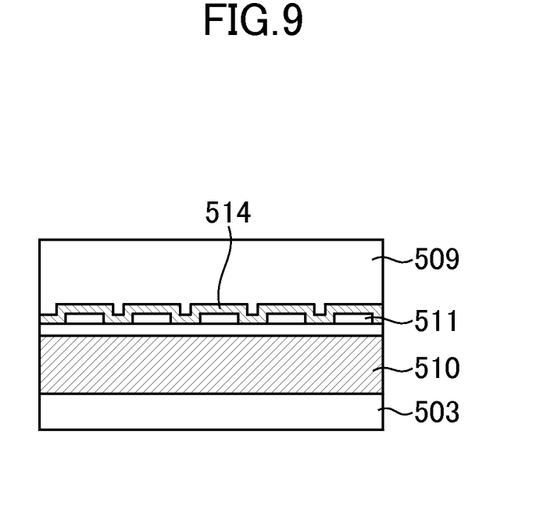
FIG. 9 schematically shows enlarged the part indicated by C in FIG. 8.
Figure 10:
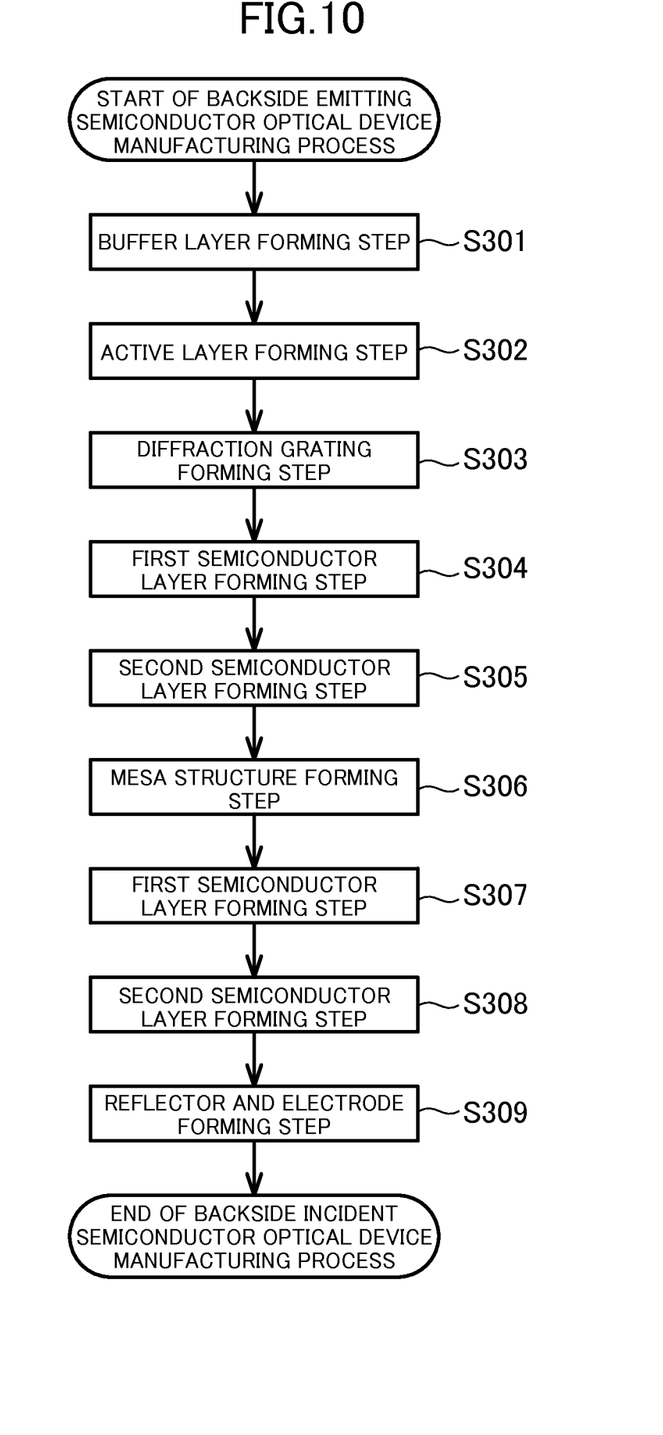
FIG. 10 schematically shows a manufacturing process of the semiconductor laser device shown in FIG. 8

FIG. 8 is a partially sectional perspective view, similar to FIG. 2, explaining a structure of a semiconductor laser device 500 according to a third embodiment. The semiconductor laser device 500 shown is a backside emitting semiconductor optical device, and the device structure thereof is referred to as a planar BH structure. FIG. 9 schematically shows enlarged the part indicated by C in FIG. 8, and FIG. 10 shows a manufacturing process of the semiconductor laser device 500 in FIG. 8. Although the MOVPE method is used here again as a growing method, the growing method is not limited to the MOVPE method and any other method that can produce the same effect can be used. Materials used here are the same as those in the first and second embodiments.

In the following, a manufacturing process of the semiconductor laser device 500 will be described while referring to the structure thereof. Similar to the first embodiment, initially, at a buffer layer forming step S301, an active layer forming step S302, and a diffraction grating forming step S303, an n-InP buffer layer 503, an InGaAlAs made MQW layer 510 in the laser unit, and a diffraction grating 511 are formed on the n-InP substrate 502. In the above, generally, a p-InP cap layer is formed for surface protection in most of the cases. After formation of the diffraction grating 511 in normal process, Al organic metal is supplied to form an undoped AlInP layer 514 of 0.3 nm thick at a first semiconductor layer forming step S304. In the above, although the Al concentration is set to $1 \times 10^{18}$ cm$^{-3}$, the Al concentration may be desirably set within the range between $1 \times 10^{16}$ and $1 \times 10^{20}$ cm$^{-3}$ inclusive. Further, at a second semiconductor layer forming step S305, a first thin p-InP cladding layer 509 that is a second semiconductor layer with Mg doped therein and an InGaAsP cap layer are grown.

At a mesa structure forming step S306, after a mesa stripe mask is formed on the above descried multi-layer structure and a part other than the mesa structure is removed by etching, appropriate preprocessing is executed, and an Ru doped InP layer 504 is formed through buried-hetero growing, using the method according to the present invention. In the above, CH$_3$Cl is added simultaneously. Thereafter, after the mask is removed and appropriate preprocessing is then executed to remove the InGaAsP cap layer, Al organic metal is supplied at the second-time first semiconductor layer forming step S307 to form an undoped AlInP layer 508 of 5 nm thick that is a first semiconductor layer. The Al concentration in the above is set to $1 \times 10^{18}$ cm$^{-3}$. Further, at the second-time second semiconductor layer forming step S308, a second p-InP cladding layer 505 that is a second semiconductor layer with Mg doped therein and a p-InGaAsP contact layer 506 are successively formed. In the above, regrowth is applied under a condition for smoothening the unevenness of the crystal surface formed through buried-hetero structure growth of Ru doped InP 504. Thereafter, at a reflector and electrode forming step S309, a reflecting mirror 512 having an angle of 135 degrees is formed on the front surface, a rear surface lens 513 for converging an emitting light is formed on the rear surface, and an upper electrode 507 and a lower electrode 501 are formed, whereby the semiconductor laser element 500 is completed.

A device resistance of the semiconductor laser device 500 manufactured as described above is as low as 2 ohm, and the semiconductor laser device 500 oscillates with a low threshold current of 10 mA at 85° C. In addition, the semiconductor laser device 500 exhibits preferable modulation characteristic of 10 Ghz without a cooling device. The device characteristic is not deteriorated after a long time operation, which proves high device reliability. Further, a high yield rate in generation of the semiconductor laser device 500 is resulted.

While there have been described what are at present considered to be certain embodiments of the invention, it will be understood that various modifications may be made

What is claimed is:

1. A semiconductor optical device, comprising:
   a substrate made of InP;
   an active layer for emitting light through recombination of an electron and a hole, the active layer being formed over the substrate;
   a diffraction grating having a pitch defined in accordance with an output wavelength of the light emitted;
   a first semiconductor layer including at least Al, made of In and a group-V compound, and formed in direct physical contact with a top of the diffraction grating; and
   a second semiconductor layer including Mg, not including Al, made of InP, and formed in direct physical contact with a top of the first semiconductor layer,
   wherein the first semiconductor layer is undoped and has a thickness between 0.3 nm and 5 nm inclusive, and the second semiconductor layer is a cladding layer.

2. The semiconductor optical device according to claim 1, wherein a concentration of Al in the first semiconductor layer is between $1 \times 10^{16}$ and $1 \times 10^{20}$ cm$^{-3}$ inclusive.

3. A manufacturing method of a semiconductor optical device, the method comprising:
   a substrate preparing step of preparing a substrate made of InP;
   an active layer forming step of forming an active layer over the substrate for emitting light through recombination of an electron and a hole;
   a diffraction grating forming step of forming a diffraction grating having a pitch defined in accordance with an output wavelength of the light emitted;
   a first semiconductor layer forming step of forming a first semiconductor layer including at least Al, made of In and a group-V compound, and formed in direct physical contact with a top of the diffraction grating; and
   a second semiconductor layer forming step of forming a second semiconductor layer including Mg, not including Al, made of InP, and formed in direct physical contact with a top of the first semiconductor layer,
   wherein the first semiconductor layer is undoped and has a thickness between 0.3 nm and 5 nm inclusive and the second semiconductor layer is a cladding layer.

4. The manufacturing method of a semiconductor optical device according to claim 3, wherein a concentration of Al in the first semiconductor layer of the semiconductor optical device is between $1 \times 10^{16}$ and $1 \times 10^{20}$ cm$^{-3}$ inclusive.

* * * * *